(12) United States Patent
Cai et al.

(10) Patent No.: US 12,717,248 B2
(45) Date of Patent: Aug. 25, 2026

(54) OFF-AXIS THROUGH THE LENS MUTUALLY COHERENT DARK FIELD IMAGING SYSTEM WITH INCOHERENT LIGHT FOR OVERLAY METROLOGY

(71) Applicant: KLA Corporation, Milpitas, CA (US)

(72) Inventors: Wenjian Cai, Sunnyvale, CA (US); Andrew V. Hill, Berkley, CA (US); Xuefeng Liu, San Jose, CA (US); John Fielden, Los Altos, CA (US); Yung-Ho Alex Chuang, Cupertino, CA (US); Huimin Ouyang, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 76 days.

(21) Appl. No.: 18/978,376

(22) Filed: Dec. 12, 2024

(65) Prior Publication Data

US 2025/0271775 A1 Aug. 28, 2025

Related U.S. Application Data

(60) Provisional application No. 63/556,863, filed on Feb. 22, 2024.

(51) Int. Cl.
*G03F 7/00* (2006.01)

(52) U.S. Cl.
CPC .... *G03F 7/70633* (2013.01); *G03F 7/706849* (2023.05); *G03F 7/706851* (2023.05)

(58) Field of Classification Search
CPC ........... G03F 7/70633; G03F 7/706849; G03F 7/706851; G03F 7/20; G01B 11/272
See application file for complete search history.

(56) References Cited

U.S. PATENT DOCUMENTS 9,927,701 B2 * 3/2018 Kawashima .......... G03F 7/0002
11,281,111 B2 3/2022 Shalibo et al.
(Continued)

FOREIGN PATENT DOCUMENTS

WO WO-2018219639 A1 * 12/2018 ....... G01N 21/95623

OTHER PUBLICATIONS

Korean Intellectual Property Office, International Search Report and Written Opinion received in International Application No. PCT/US2025/016697, Jun. 9, 2025, 9 pages.

*Primary Examiner* — Abdullahi Nur
(74) *Attorney, Agent, or Firm* — Suiter Swantz IP

(57) ABSTRACT

A metrology system is disclosed. The system includes an incoherent illumination source to generate incoherent illumination. The system includes a diffraction grating to split the incoherent illumination. The system includes an objective lens to direct one or more pairs of mutually coherent illumination beams to a metrology target on a sample and collect sample light associated with diffraction of pairs of mutually coherent illumination beams. The system includes a mask configured to pass a single nonzero-order diffraction beam and block a zero-order diffraction beam associated with each of the mutually coherent illumination beams. The system includes a detector configured to generate an image of the metrology target based on light passed by the mask. The system includes a controller communicatively coupled to the detector, including one or more processors configured to generate one or more metrology measurements of the sample based on the image.

28 Claims, 11 Drawing Sheets

(56) References Cited

U.S. PATENT DOCUMENTS

| | | | | |
|---|---|---|---|---|
| 12,032,300 | B2 | 7/2024 | Hill et al. | |
| 2005/0286052 | A1 | 12/2005 | Huggins et al. | |
| 2011/0027704 | A1 | 2/2011 | Cramer et al. | |
| 2018/0122668 | A1* | 5/2018 | He | G03F 7/70633 |
| 2022/0299308 | A1* | 9/2022 | Shchegrov | G01B 11/272 |
| 2022/0397832 | A1 | 12/2022 | Alpeggiani et al. | |
| 2023/0133640 | A1 | 5/2023 | Hill et al. | |
| 2023/0259040 | A1 | 8/2023 | Hill et al. | |
| 2024/0329543 | A1 | 10/2024 | Hill et al. | |

* cited by examiner

OFF-AXIS THROUGH THE LENS MUTUALLY COHERENT DARK FIELD IMAGING SYSTEM WITH INCOHERENT LIGHT FOR OVERLAY METROLOGY

CROSS-REFERENCE TO RELATED APPLICATION

The present application claims the benefit under 35 U.S.C. § 119 (e) of U.S. Provisional Application Ser. No. 63/556,863, filed Feb. 22, 2024, entitled OFF-AXIS THROUGH THE LENS MUTUALLY-COHERENT DARK FIELD IMAGING SYSTEM WITH INCOHERENT LIGHT FOR OVERLAY METROLOGY, which is incorporated herein by reference in the entirety.

TECHNICAL FIELD

The present disclosure relates generally to overlay metrology and, more particularly, to dark-field imaging overlay metrology.

BACKGROUND

Overlay metrology systems typically characterize the overlay alignment of multiple layers of a sample by measuring the relative positions of metrology target features located on layers of interest. As the size of fabricated features decreases and the feature density increases, the demands on overlay metrology systems needed to characterize these features increase. In particular, smaller features require more sensitive and more accurate measurements of small alignment errors. Accordingly, it is desirable to develop systems and methods to address these demands.

SUMMARY

A metrology system is disclosed, in accordance with one or more embodiments of the present disclosure. In embodiments, the metrology system includes an incoherent illumination source to generate incoherent illumination. In embodiments, the metrology system includes a diffraction grating to split the incoherent illumination into one or more pairs of mutually coherent illumination beams. In embodiments, the metrology system includes an objective lens to direct the one or more pairs of mutually coherent illumination beams to a metrology target on a sample, wherein the metrology target is configured in accordance with a metrology recipe to include periodic features associated with two or more lithographic exposures, wherein the objective lens further collects sample light associated with diffraction of the one or more pairs of mutually coherent illumination beams. In embodiments, the metrology system includes one or more masks, wherein the one or more masks are configured in accordance with the metrology recipe to pass a single nonzero-order diffraction beam and block a zero-order diffraction beam associated with each of the mutually coherent illumination beams of the one or more pairs of mutually coherent illumination beams. In embodiments, the metrology system includes a detector configured to generate an image of the metrology target based on light passed by the one or more masks. In embodiments, the metrology system includes a controller communicatively coupled to the detector, wherein the controller includes one or more processors configured to execute program instructions causing the one or more processors to generate one or more metrology measurements of the sample based on the image in accordance with the metrology recipe.

A metrology method is disclosed, in accordance with one or more embodiments of the present disclosure. In embodiments, the metrology method includes generating, with an incoherent illumination source, incoherent illumination. In embodiments, the metrology method includes diffracting, with a diffraction grating, the incoherent illumination into one or more pairs of mutually coherent illumination beams. In embodiments, the metrology method includes directing, with an objective lens, the one or more pairs of mutually coherent illumination beams to a metrology target on a sample, wherein the metrology target is configured in accordance with a metrology recipe to include periodic features associated with two or more lithographic exposures. In embodiments, the metrology method includes collecting, with the objective lens, sample light associated with diffraction of the one or more pairs of mutually coherent illumination beams. In embodiments, the metrology method includes passing, with one or more masks, a single nonzero-order diffraction beam associated with each of the mutually coherent illumination beams of the one or more pairs of mutually coherent illumination beams. In embodiments, the metrology method includes blocking, with the one or more masks, a zero-order diffraction beam associated with each of the mutually coherent illumination beams of the one or more pairs of mutually coherent illumination beams; generating, with a detector, an image of the metrology target based on light passed by the one or more masks. In embodiments, the metrology method includes generating one or more metrology measurements of the sample based on the image in accordance with the metrology recipe.

A metrology system is disclosed, in accordance with one or more embodiments of the present disclosure. In embodiments, the metrology system includes a diffraction grating including one or more diffraction grating cells having a direction of periodicity configured to split incoherent illumination from an incoherent illumination source into one or more pairs of mutually coherent illumination beams. In embodiments, the metrology system an objective lens to direct the one or more pairs of mutually coherent illumination beams from the beamsplitter to a metrology target on a sample, wherein the metrology target is configured in accordance with a metrology recipe including two or more lithographic exposures to generate periodic features having a direction of periodicity arranged into one or more target cells, wherein the direction of periodicity of a target cell corresponds to the direction of periodicity of a diffraction grating cell, wherein the objective lens further collects sample light associated with diffraction of the one or more pairs of mutually coherent illumination beams. In embodiments, the metrology system one or more masks, wherein the one or more masks are configured in accordance with the metrology recipe to pass a single nonzero-order diffraction beam and block a zero-order diffraction beam associated with each of the mutually coherent illumination beams of the one or more pairs of mutually coherent illumination beams. In embodiments, the metrology system a detector configured to generate an image of the metrology target based on light passed by the one or more masks. In embodiments, the metrology system a controller communicatively coupled to the detector, wherein the controller includes one or more processors configured to execute program instructions causing the one or more processors to generate one or more metrology measurements of the sample based on the image in accordance with the metrology recipe.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1A:
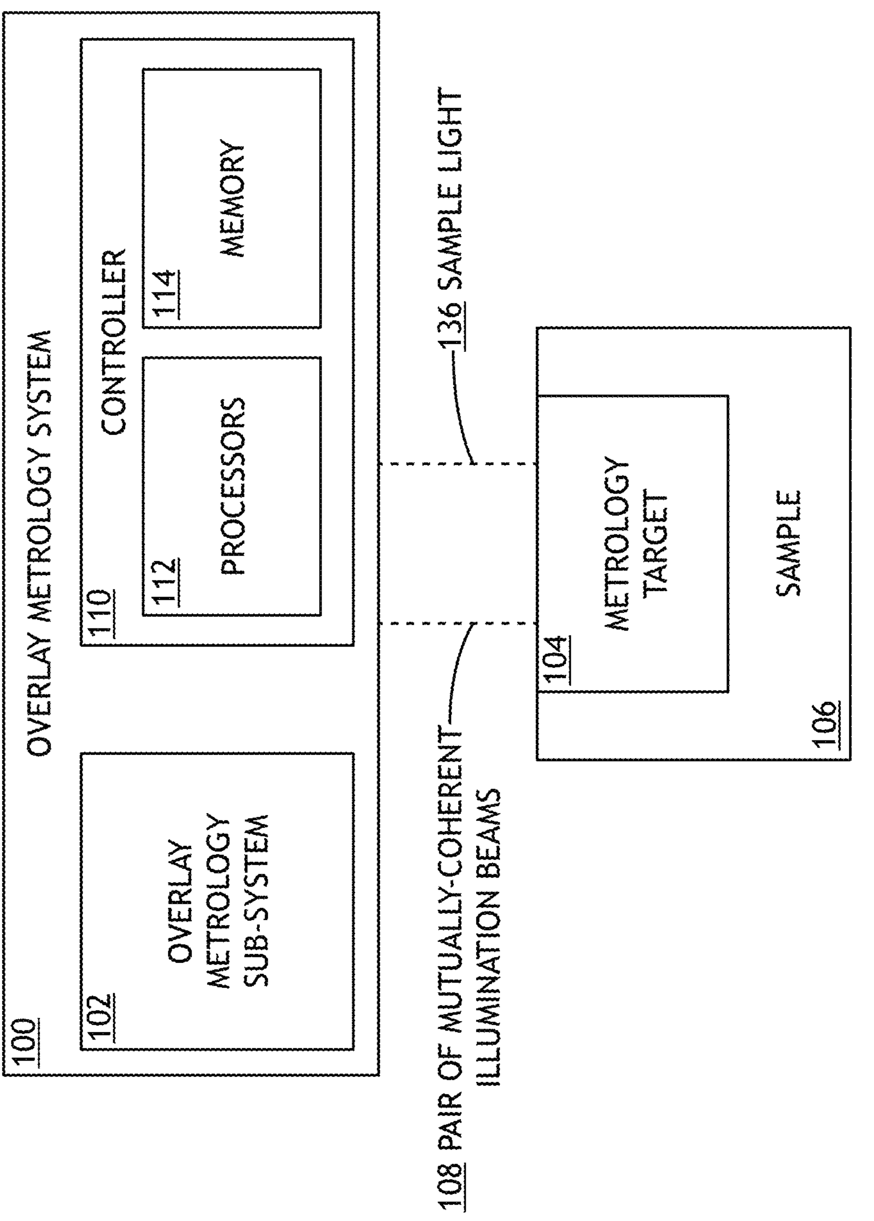
FIG. 1A illustrates a block diagram illustrating an overlay metrology system, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

Embodiments of the present disclosure are directed to systems and methods for overlay metrology with pairs of mutually coherent illumination beams (e.g., mutually coherent illumination beam pairs). The pairs of mutually coherent illumination beams may originate from an incoherent illumination source, where the illumination from the incoherent illumination source is diffracted by a diffraction grating to form one or more pairs of mutually coherent illumination beams.

This may have the advantage of suppressing speckle in an image and reducing edge effect. Additionally, formed dark field images may be color corrected so long as collected illumination is corrected, which may result in a formed grating image being independent of an illumination source wavelength, which may allow a larger bandwidth of light to be used.

Overlay metrology using pairs of mutually coherent illumination beams generated by a coherent light source is disclosed in U.S. Pat. No. 12,032,300, entitled "Imaging overlay with mutually-coherent oblique illumination" and issued on Jul. 9, 2024, and U.S. patent application Ser. No. 18/742,869, entitled "Imaging overlay with mutually-coherent oblique illumination" and filed on Jun. 13, 2024, which are herein incorporated by reference in its entirety.

A metrology target may be illuminated with a pair of mutually-coherent illumination beams at symmetric azimuth angles for each measurement direction of interest. For example, an overlay measurement for a single measurement direction may utilize one pair of mutually-coherent illumination beams, while an overlay measurement for two measurement directions (e.g., two orthogonal measurement directions) may utilize two pairs of mutually-coherent illumination beams. Further, although illumination beams within each pair are mutually-coherent, it is not necessary for beams in different pairs to be mutually-coherent. Rather, it may be beneficial but not required that the pairs of illumination beams are incoherent with respect to each other.

A metrology target and/or an overlay metrology tool suitable for characterizing the metrology target may be configured according to a metrology recipe suitable for generating overlay measurements based on a desired technique. More generally, an overlay metrology tool may be configurable according to a variety of metrology recipes to perform overlay measurements using a variety of techniques and/or perform overlay measurements on a variety of metrology targets with different designs.

For example, a metrology recipe may include various aspects of a metrology target or a design of a metrology target including, but not limited to, a layout of target features on one or more sample layers, feature sizes, or feature pitches. As another example, a metrology recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a recipe of an overlay metrology tool may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters.

In some embodiments, an overlay metrology tool is configured (e.g., according to a metrology recipe) to image a metrology target having periodic structures using a single non-zero diffraction lobe from each illumination beam in a mutually-coherent illumination beam pair. In this configuration, the periodic structures from the metrology target may be imaged in a dark-field imaging mode as sinusoidal interference patterns. Further, overlay may be determined by comparing relative phases of various imaged sinusoidal patterns of a metrology target. An overlay metrology system may be configured in multiple ways in accordance with the systems and method disclosed herein. In some embodiments, an overlay metrology system is configured to direct a pair of mutually-coherent illumination beams to a metrology target within a numerical aperture (NA) of an objective lens used to collected light from the metrology target for imaging, which is referred to herein as through-the-lens (TTL) illumination. In this configuration, the overlay metrology system may include one or more elements to block zero-order diffraction such that it does not contribute to image formation.

It is contemplated herein that overlay metrology based on mutually-coherent illumination beam pairs as disclosed herein may provide multiple advantages relative to existing image-based overlay metrology techniques based on incoherent illumination including, but not limited to, support of fine grating pitches, high image contrast, high image brightness, matched brightness between cells of a metrology target, insensitivity to monochromatic aberrations (e.g., defocus, or the like), minimal encroachment of cell edges, and/or minimal stray light.

For example, image contrast of periodic features is high (maximized in some cases) by interfering only two diffracted orders with equal amplitudes. As another example in the case of an r-AIM target, image brightness is matched between target cells since only grating pitches differ between cells.

In some embodiments, the overlay metrology measurements are used to generate correctables to control one or more additional process tools such as, but not limited to, a lithography tool, an etching tool, or a polishing tool.

FIG. 1A illustrates a block diagram illustrating an overlay metrology system 100, in accordance with one or more embodiments of the present disclosure.

In some embodiments, the overlay metrology system 100 includes an overlay metrology sub-system 102 configured to illuminate a metrology target 104 on a sample 106 with a pair of mutually-coherent illumination beams 108. In particular, each of the illumination beams 108*a,b* may fully illuminate the entirety of a metrology target 104. In this way, each cell of the metrology target 104 receives common illumination conditions to promote matched image brightness for all of the cells.

In embodiments, the sample 106 may be disposed on a sample stage (not shown) suitable for securing the sample 106 and further configured to position the metrology target 104 with respect to the illumination beams 108.

The metrology target 104 may include various periodic features, which may have a periodicity. In embodiments, the metrology target 104 may have periodic features that have a periodicity along a single measurement direction (e.g., an x-direction or a y-direction). In embodiments, the metrology target 104 may include a first set of periodic features along a first measurement direction (e.g., an x-direction) and a second set of periodic features along a second measurement direction (e.g., a y-direction).

In embodiments, the periodic features of the metrology target may be arranged into two or more target cells.

It is contemplated herein that various metrology target designs are suitable for overlay measurements with mutually-coherent illumination beam pairs as disclosed herein. In embodiments, a metrology target 104 is an advanced imaging metrology (AIM) target. In this configuration, each cell of the metrology target 104 may include grating structures from different lithographic exposures in non-overlapping regions on one or more layers, where the grating structures from the different lithographic exposures have the same pitch. In embodiments, the metrology target 104 is a Moiré target. In this configuration, each cell may include grating structures from different lithographic exposures in overlapping regions on two layers to form grating-over-grating structures or Moiré structures, where the grating structures from the different lithographic exposures have different pitches. Further, a cell may include a pair of Moiré structures in which the pitches on the constituent layers are reversed relative to each other. For example, a first Moiré structure may have a first pitch on a first layer and a second pitch on a second layer, while a second Moiré structure may have the first pitch on the second layer and the second pitch on the first layer. Such a metrology target 104 may be referred to as a robust-AIM (r-AIM) metrology target and provides that an overlay measurement may be determined based on relative phases between the two Moiré structures.

The overlay metrology sub-system 102 may image a metrology target 104 based on a single non-zero diffraction lobe associated with each illumination beam 108 in each pair of mutually-coherent illumination beams 108. In this way, the overlay metrology sub-system 102 may provide a dark-field image since zero-order diffraction of the illumination beams 108 does not contribute to image formation. Further, since each pair of illumination beams 108 is mutually-coherent, the single diffraction lobe associated with each illumination beam 108 in the pair interferes with its counterpart to form a sinusoidal interference pattern in the image. As a result, the various grating structures in the metrology target 104 may be imaged with high contrast as pure sinusoids such that overlay measurements may be generated based on comparisons of relative phases of the neighboring cell images in accordance with a metrology recipe.

In embodiments, the overlay metrology system 100 includes a controller 110 communicatively coupled to the overlay metrology sub-system 102. The controller 110 may be configured to direct the overlay metrology sub-system 102 to generate dark-field images based on one or more selected metrology recipes. The controller 110 may be further configured to receive data including, but not limited to, dark-field images from the overlay metrology sub-system 102. Additionally, the controller 110 may be configured to determine overlay associated with a metrology target 104 based on the acquired dark-field images. As another example, the controller 110 may generate correctables to control, based on the overlay metrology measurements, one or more process tools such as, but not limited to, a lithography tool, an etching tool, or a polishing tool. Correctables may be generated to control one or more process tools in any combination of a feedback control loop or a feed-forward control loop. As an illustration, feedback correctables generated in response to metrology measurements on a sample 106 may control a process tool during the fabrication of additional samples in the same or different lots (e.g., in response to drifts of the process tools). As another illustration, feed-forward correctables generated in response metrology measurements on a sample 106 may be used to control a process tool during fabrication of additional features on the sample 106 in future process steps.

In some embodiments, the controller 110 includes one or more processors 112. For example, the one or more processors 112 may be configured to execute a set of program instructions maintained in a memory 114, or memory device.

The one or more processors 112 of a controller 110 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 112 may include any device configured to execute algorithms and/or instructions (e.g., program instructions stored in memory). In embodiments, the one or more processors 112 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 110 may include one or more controllers housed in a common housing or within multiple housings. In this way, any controller or combination of controllers may be separately packaged as a module suitable for integration into the overlay metrology system 100.

The memory 114 may include any storage medium known in the art suitable for storing program instructions executable by the associated one or more processors 112. For example, the memory 114 may include a non-transitory memory medium. By way of another example, the memory 114 may include, but is not limited to, a read-only memory (ROM), a random-access memory (RAM), a magnetic or optical memory device (e.g., disk), a magnetic tape, a solid-state drive, and the like. It is further noted that the memory 114 may be housed in a common controller housing with the one or more processors 112. In some embodiments, the memory 114 may be located remotely with respect to the physical location of the one or more processors 112 and the controller 110. For instance, the one or more processors 112 of the controller 110 may access a remote memory (e.g., server), accessible through a network (e.g., internet, intranet, and the like).

Figure 1B:
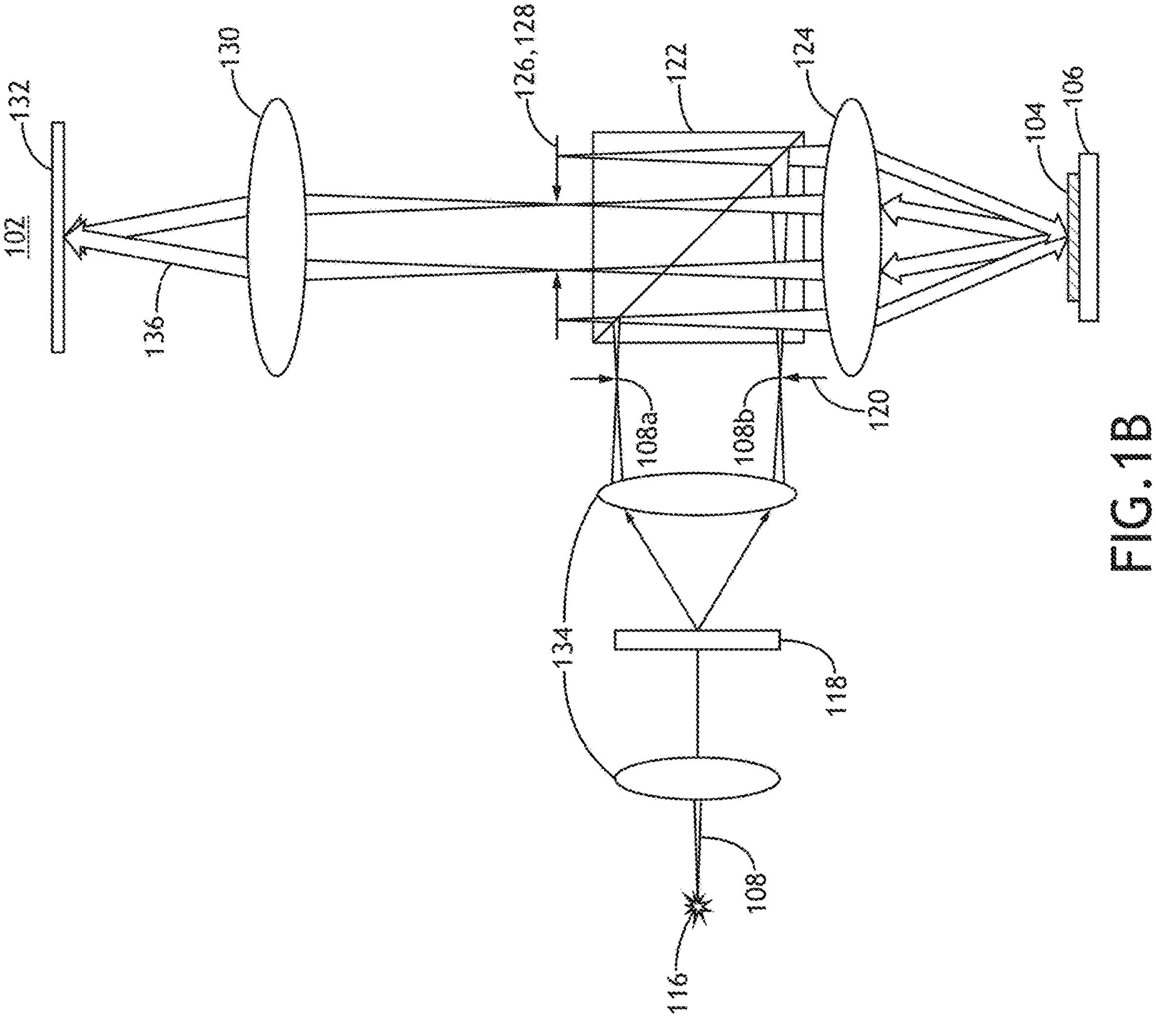
FIG. 1B illustrates a simplified schematic view of an overlay metrology sub-system, in accordance with one or more embodiments of the present disclosure.

FIG. 1B illustrates a simplified schematic view of an overlay metrology sub-system 102, in accordance with one or more embodiments of the present disclosure.

In embodiments, the overlay metrology sub-system 102 includes an incoherent illumination source 116. The incoherent illumination source 116 may be configured to generate incoherent illumination. The incoherent illumination source 116 may be any incoherent illumination source 116 known in the art suitable for generating incoherent illumination. For example, the incoherent illumination source 116 may be a lamp source (e.g. a laser-sustained plasma light source), a supercontinuum source, or a broadband illumination source (e.g., when the objective lens 124 is corrected for chromatic aberration and the image is color-corrected). By way of another example the incoherent illumination source 116 may be an incandescent light bulb (e.g., a traditional tungsten filament bulb), fluorescent lights, or most light emitting diode (LED) lights. A singular incoherent illumination source 116 may generate the entirety of the light used to illuminate the sample 106.

In embodiments, the overlay metrology sub-system 102 includes a diffraction grating 118. The diffraction grating 118 may be configured to split the incoherent illumination from the incoherent illumination source 116 into one or more pairs of mutually-coherent illumination beams 108*a,b*. The diffraction grating 118 may be located at a field plane conjugate to the sample 106.

The diffraction grating 118 may be segmented to have different properties (e.g., pitch or orientation). This may permit different areas (e.g., different metrology targets 104) on a sample 106 to be illuminated by independent off-axis illumination. Multiple diffraction gratings 118 may also be arranged on a slide or a wheel to provide additional configurations of off-axis illumination.

In embodiments, the overlay metrology sub-system 102 includes an illumination pupil 120, wherein an illumination beam 108 passes through the illumination pupil 120.

In embodiments, the overlay metrology sub-system 102 includes one or more illumination optics 134. For example, each of the illumination optics 134 may include, but is not required to include, one or more illumination lenses (e.g., to control a spot size of the illumination beam 108 on the metrology target 104, to relay pupil and/or field planes, or the like), one or more polarizers to adjust the polarization of the illumination beam 108, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In embodiments, the overlay metrology sub-system 102 includes an objective lens 124. The objective lens 124 may direct the one or more pairs of mutually-coherent illumination beams 108*a,b* to a metrology target 104 on a sample 106. Additionally, the objective lens 124 may direct sample light 136 associated with the diffraction of the one or more pairs of mutually-coherent illumination beams 108*a,b* to a detector 132.

In embodiments, the overlay metrology sub-system 102 includes a tube lens 130. The tube lens 130 may be positioned near a detector 132 and be configured to direct light from the sample 106 to the detector 132.

In embodiments, the overlay metrology sub-system 102 includes a detector 132. The detector 132 may be configured to generate an image of the metrology target 104 based on light (e.g., sample light 136). The detector 132 may be communicatively coupled to the controller 110. The one or more processors 112 of the controller 110 may be configured to execute one or more sets of program instructions which may cause the one or more processors 112 to generate one or more metrology measurements of the sample 106 based on the image, in accordance with the metrology recipe.

Figure 2A:
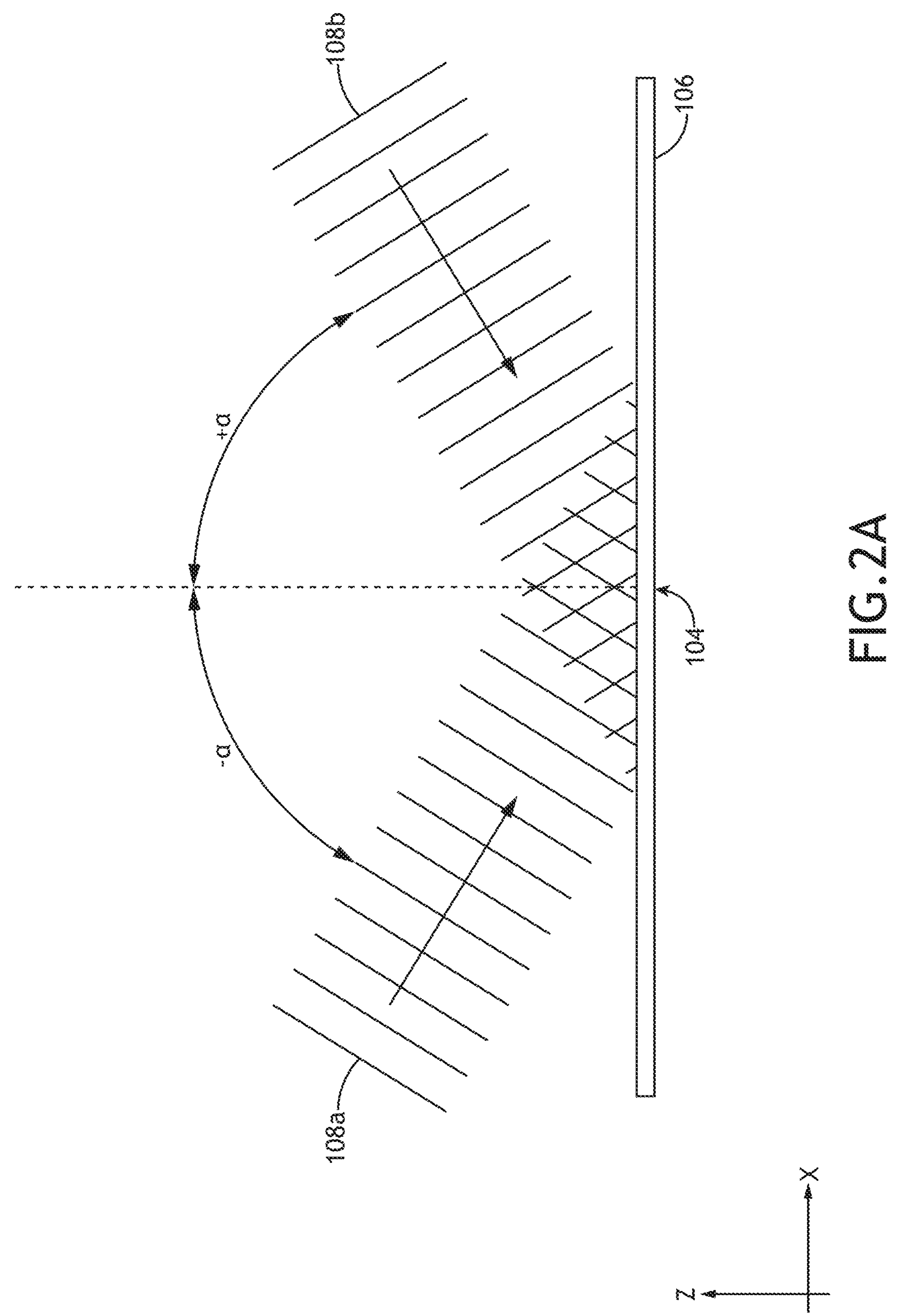
FIG. 2A illustrates a conceptual diagram of illuminating a metrology target with a pair of mutually coherent illumination beams, in accordance with one or more embodiments of the present disclosure.
Figure 2B:
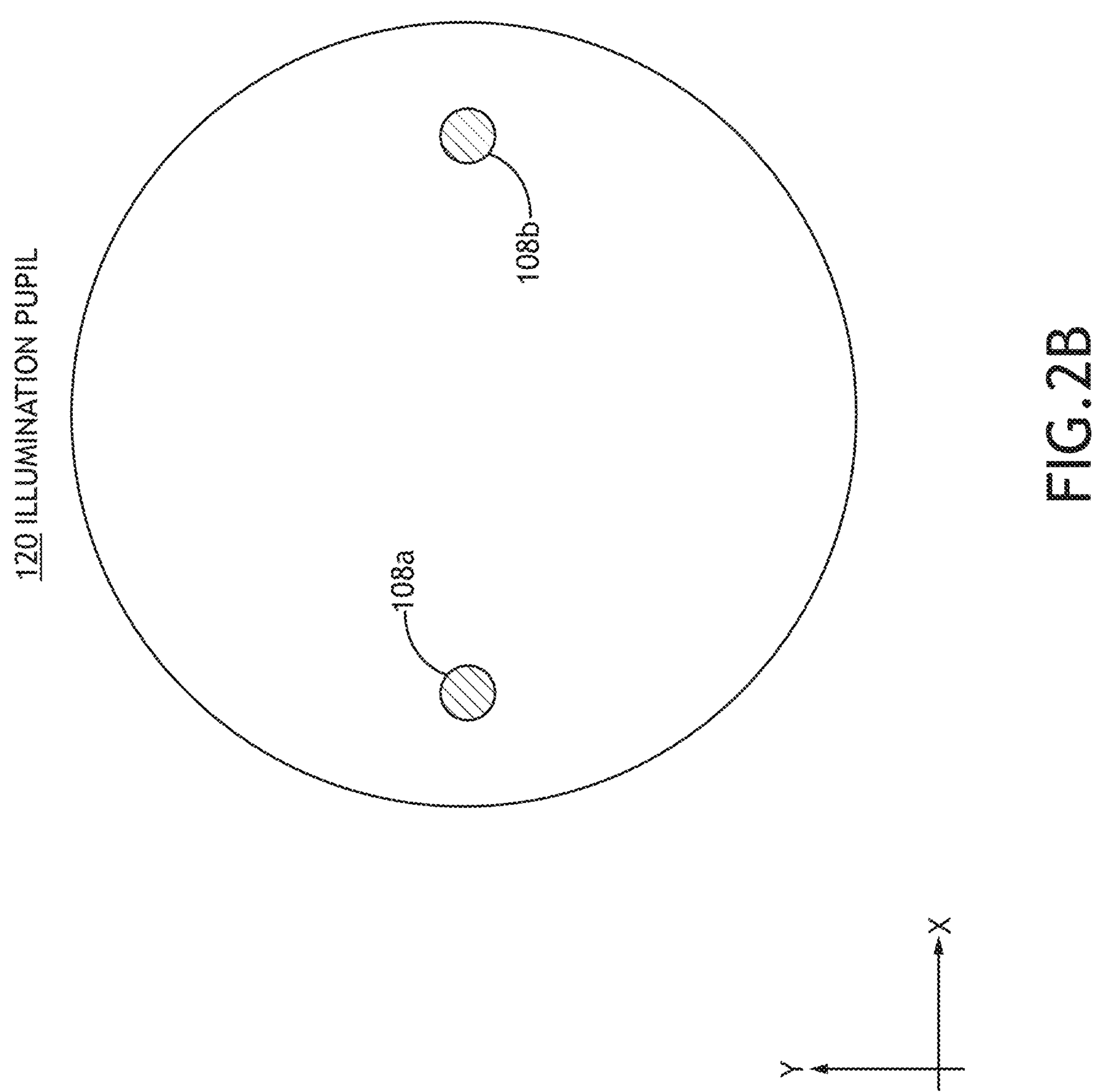
FIG. 2B illustrates a top view of an illumination pupil with a single pair of mutually coherent illumination beams, in accordance with one or more embodiments of the present disclosure.
Figure 2C:
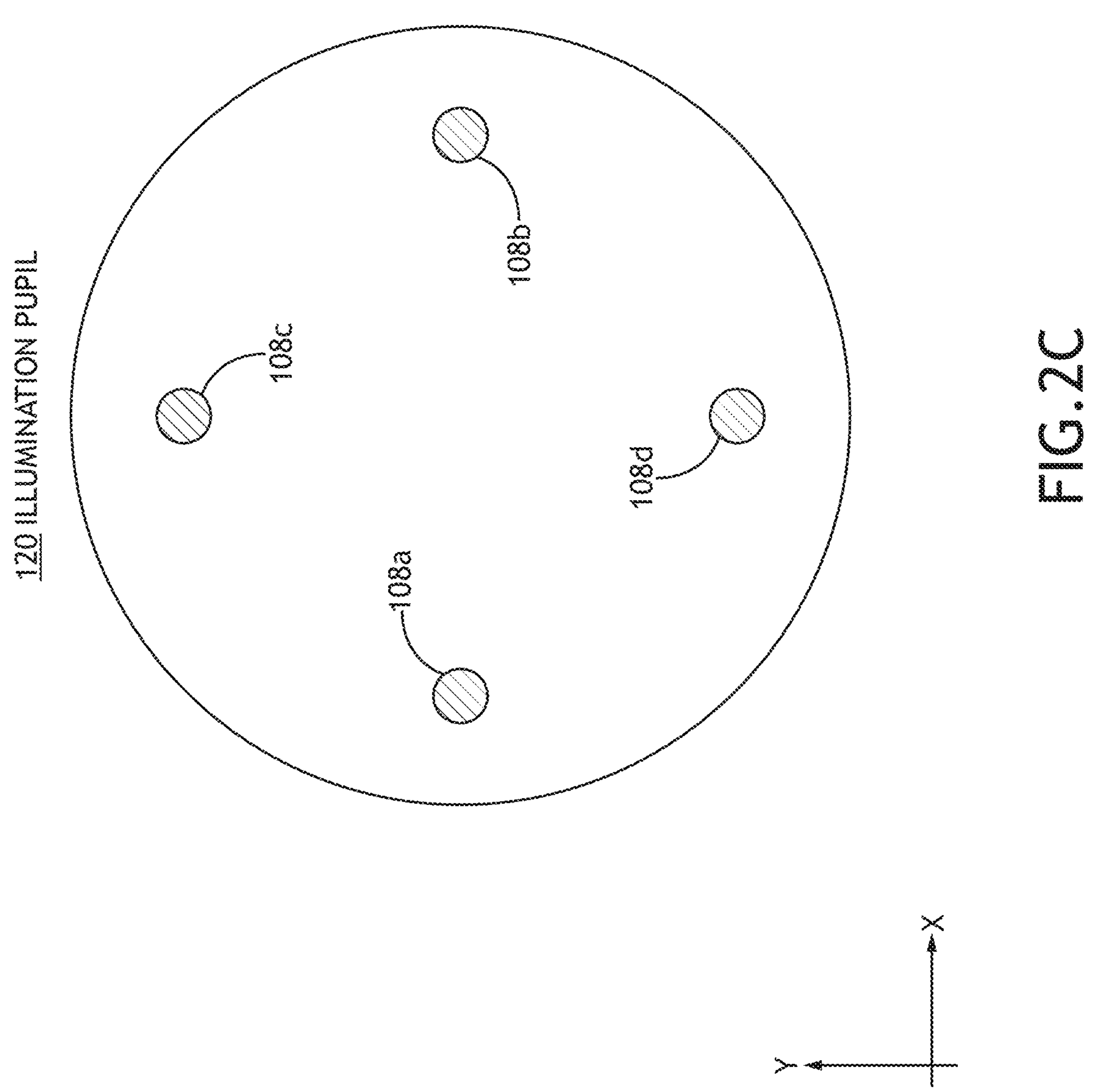
FIG. 2C illustrates a top view of an illumination pupil with two pairs of mutually coherent illumination beams, in accordance with one or more embodiments of the present disclosure.

Referring now to FIGS. 2A-2C, aspects of illumination with the overlay metrology sub-system 102 are described in greater detail. FIG. 2A generally illustrates illumination of the metrology target. FIG. 2B illustrates an illumination pupil 120 for dipole illumination. FIG. 2C illustrates an illumination pupil 120 for quadrupole illumination.

FIG. 2A illustrates a conceptual diagram of illuminating a metrology target 104 with a pair of mutually-coherent illumination beams 108*a,b*, in accordance with one or more embodiments of the present disclosure.

FIG. 2A depicts two illumination beams 108*a,b* as a pair of mutually-coherent illumination beams 108. In some embodiments, the overlay metrology sub-system 102 directs a pair of mutually-coherent illumination beams 108 at symmetric incidence angles. For example, the illumination beams 108*a,b* have symmetric polar incidence angles (±α) and symmetric (e.g., opposing) azimuth incidence angles. In FIG. 2A, this is illustrated by the two illumination beams 108*a,b* propagating in opposite azimuth directions in a plane of the figure.

FIG. 2B illustrates a top view of an illumination pupil 120 with one pair of mutually-coherent illumination beams 108*a,b*, in accordance with one or more embodiments of the present disclosure. FIG. 2B illustrates the pair of mutually-coherent illumination beams 108*a,b* as dipole illumination. In some embodiments, such a metrology target 104 includes grating structures along the X direction. In some embodiments, such a metrology target 104 includes grating structures along a different direction. In this case, the distribution in FIG. 2B may be a rotated dipole configuration.

In embodiments, the one or more pairs of mutually-coherent illumination beams may be a single pair of mutually-coherent illumination beams 108*a,b*. The single pair of mutually-coherent illumination beams 108*a,b* may be used when periodic features on the metrology target 104 have a periodicity along a single measurement direction. Thus, the one or measurements generated from illuminating the metrology target 104 with a single pair of mutually-coherent illumination beams 108*a,b* may be associated with a single measurement direction (e.g., the measurement direction of periodicity). The single pair of mutually-coherent illumination beams 108*a,b* may be incident on the metrology target 104 at opposing azimuth angles aligned with the single measurement direction.

FIG. 2C illustrates a top view of an illumination pupil 120 illustrating two pairs of mutually-coherent illumination beams 108*a,b,c,d*, in accordance with one or more embodiments of the present disclosure. In particular, FIG. 2C depicts a first pair of mutually-coherent illumination beams 108*a,b* oriented along the X direction in the figure and a second pair of mutually-coherent illumination beams 108*c,d* oriented along the Y direction in the figure. In this way, FIG. 2C illustrates two pairs of mutually-coherent illumination beams 108 as quadrupole illumination.

In embodiments, the one or more pairs of mutually-coherent illumination beams may be two pairs of mutually-coherent illumination beams 108*a,b,c,d* (e.g., a first pair of mutually-coherent illumination beams 108*a,b* and a second pair of mutually-coherent illumination beams 108*c,d*). It is contemplated herein that the quadrupole illumination distribution of FIG. 2C may be suitable for imaging a two-dimensional (2D) metrology target 104 having grating structures oriented along two different (e.g., orthogonal) directions (e.g., a first measurement direction and a second measurement direction). In some embodiments, such a 2D metrology target 104 includes grating structures along the X and Y directions. In some embodiments, such a 2D metrology target 104 includes grating structures along two different orthogonal directions. In this case, the distribution in FIG. 2C may be a rotated quadrupole configuration.

There may be a first pair of mutually-coherent illumination beams 108*a,b*. The first pair of mutually-coherent illumination beams 108*a,b* may be incident on the metrology target 104 at opposing azimuth angles aligned with the first measurement direction. The second pair of mutually-coherent illumination beams 108*c,d* may be incident on the metrology target at opposing azimuth angles aligned with the second measurement direction. Therefore, when the metrology target 104 includes two measurement directions, two pairs of mutually-coherent illumination beams 108*a,b,c,d* may be used to generate measurements for both measurement directions.

In some embodiments, all four illumination beams 108*a,b,c,d* are mutually-coherent. In some embodiments, different pairs of mutually-coherent illumination beams 108 are incoherent with respect to each other. For example, the first pair of mutually-coherent illumination beams 108*a,b* may be mutually-coherent with respect to each other, but incoherent with respect to the second pair of mutually-coherent illumination beams 108*c,d*.

Referring again to FIG. 1B, collection of illumination from the sample 106 is described.

In embodiments, the overlay metrology sub-system 102 includes one or more optical elements to combine an illumination pathway with a collection pathway such that the objective lens 124 may both direct the mutually-coherent illumination beams 108*a*, 108*b* to the metrology target 104 and collect associated diffracted light (e.g., sample light 136). Put another way, such optical elements may enable TTL illumination and imaging with the objective lens 124.

For example, as depicted in FIG. 1B, the overlay metrology sub-system 102 may include a beamsplitter 122 to direct the mutually-coherent illumination beams 108*a*, 108*b* to the objective lens 124 and pass diffracted light collected by the objective lens 124 towards the detector 132.

As another example, the overlay metrology sub-system 102 may include a patterned mirror designed with a reflective pattern to direct the mutually-coherent illumination beams 108*a*, 108*b* to the objective lens 124 and a transmissive pattern to pass diffracted light collected by the objective lens 124 towards the detector 132. For instance, the patterned mirror may have an annular reflective pattern designed to direct the mutually-coherent illumination beams 108*a*, 108*b* to the objective lens 124, where the diffracted light collected by the objective lens 124 may pass through a transmissive portion on interior or exterior portions of the annular reflective pattern.

In embodiments, the overlay metrology sub-system 102 includes one or more masks 126 configured to pass a single, nonzero-order diffraction beam (e.g., a +1 order diffraction beam or a −1 order diffraction beam) associated with each of the one or more pairs of mutually-coherent illumination beams 108*a,b* while blocking a zero-order diffraction beam associated with each of the one or more pairs of mutually-coherent illumination beams 108*a,b*. Therefore, a dark field image may be produced by the detector 132 because zero-order diffraction is blocked by the mask 126.

The one or more masks 126 may include any component or combination of components suitable for passing pass a single diffraction beam associated with each of the mutually-coherent illumination beams 108*a,b* (e.g., a single first-order diffraction beam, a single second-order diffraction beam, or the like) while blocking zero-order diffraction beams associated with mutually-coherent illumination beams 108*a,b*. Further, the one or more masks 126 may be placed at any suitable location in the overlay metrology sub-system 102.

In embodiments, the overlay metrology sub-system 102 includes a mask 126 located at a collection pupil 128. For example, a mask 126 located at a collection pupil 128 may include one or more apertures surrounded by opaque portions, where desired diffraction orders may pass through the one or more apertures of the mask 126 while the opaque portions may block the zero-order diffraction beams as well as any other undesired light. As an illustration, a mask 126 located at a collection pupil 128 may have an annular aperture to pass desired diffraction orders to the detector 132.

In embodiments, if the overlay metrology sub-system 102 includes a patterned mirror designed with a reflective pattern to direct the mutually-coherent illumination beams 108*a*, 108*b* to the objective lens 124 and a transmissive pattern to pass diffracted light collected by the objective lens 124 towards the detector 132 as described above, this patterned mirror may operate as a mask 126.

In embodiments, the mask 126 may be configured as an annular mask with a central aperture. Therefore, the first-order diffraction used to create an image of the metrology target 104 may pass through an opening in the center of the mask 126 and the collection pupil 128.

Figure 2D:
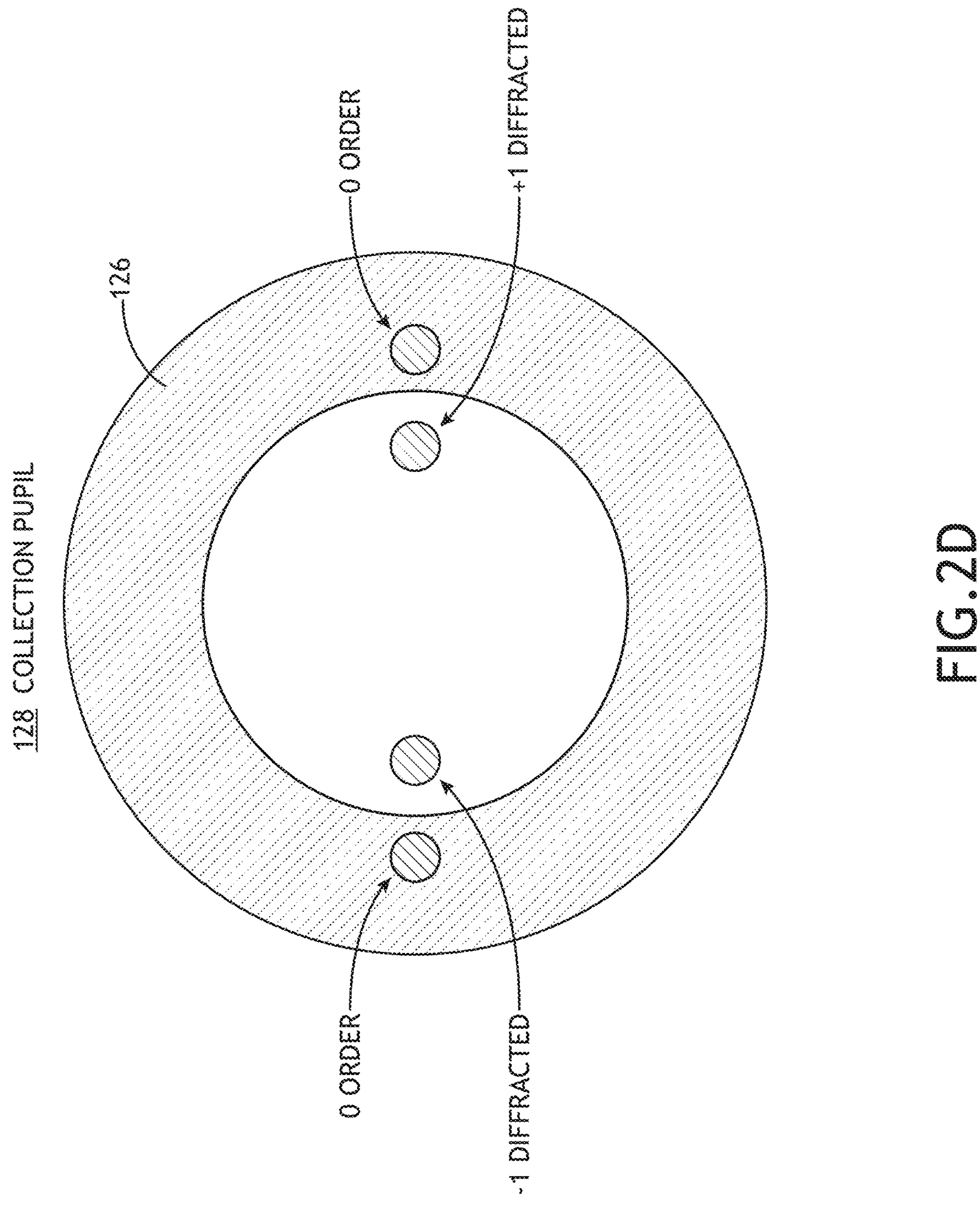
FIG. 2D illustrates a top view of a collection pupil with a mask for the single pair of mutually coherent illumination beams of FIG. 2B, in accordance with one or more embodiments of the present disclosure.
Figure 2E:
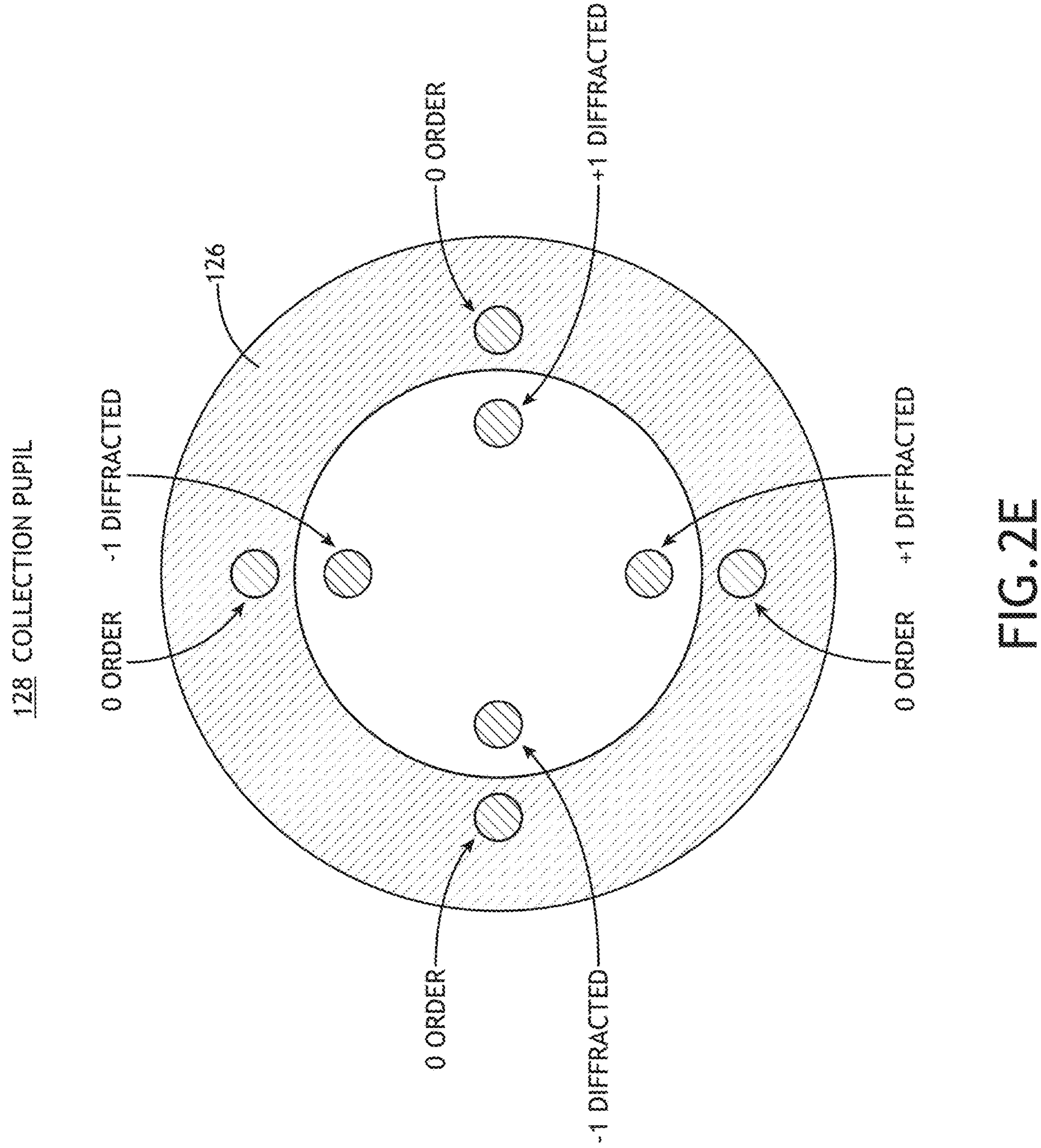
FIG. 2E illustrates a top view of a collection pupil with a mask for the two pairs of mutually coherent illumination beams of FIG. 20, in accordance with one or more embodiments of the present disclosure.
Figure 2F:
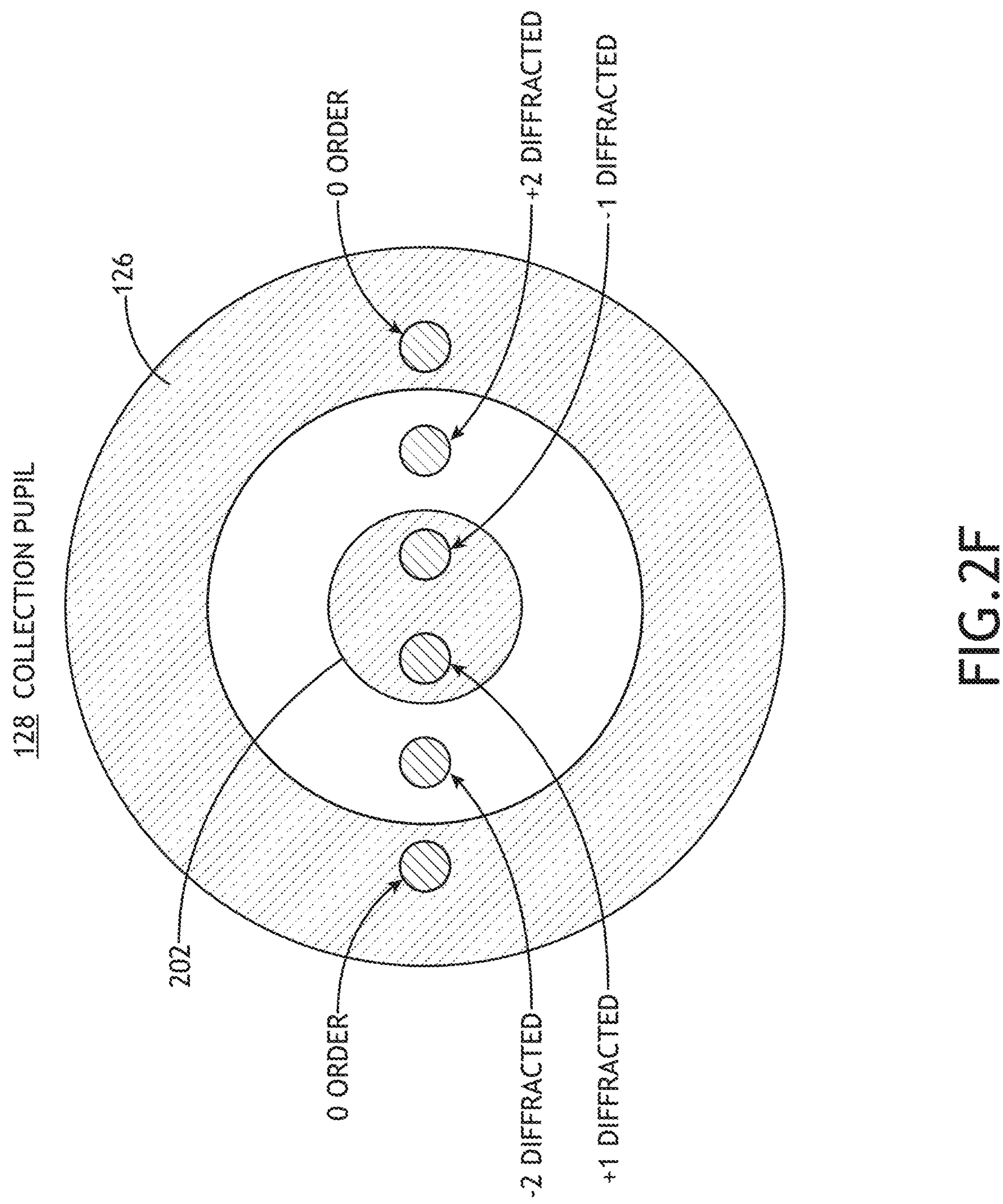
FIG. 2F illustrates a top view of a collection pupil with a mask for the single pair of mutually coherent illumination beams of FIG. 2B configured to pass second order diffraction, in accordance with one or more embodiments of the present disclosure.

Referring now to FIGS. 2D-F, masks 126 are described in greater detail. FIG. 2D illustrates a mask 126 used with the dipole illumination of FIG. 2B. FIG. 2E illustrates a mask 126 used with the quadrupole illumination of FIG. 2C. FIG. 2F illustrates a mask 126 for imaging with second order diffraction.

FIG. 2D illustrates a top view of a collection pupil 128 with a mask 126 for the single pair of mutually-coherent illumination beams 108*a,b* of FIG. 2B, in accordance with one or more embodiments of the present disclosure.

In FIG. 2D, the mask 126 on the collection pupil 128 allows only two diffracted beams of light through. The mask 126 allows a −1-order diffracted beam (e.g., associated with illumination beam 108*a*) and a +1-order diffracted beam (e.g., associated with illumination beam 108*b*). All other diffracted beams are either blocked by the mask 126 or are diffracted outside the collection pupil 128. Therefore, only the +1-order diffracted beam and the −1-order diffracted beam pass through the mask 126 and collection pupil 128 to the detector 132. This results in dark field image of the metrology target 104 to be formed, as no 0-order diffracted beam reaches the detector 132.

FIG. 2E illustrates a top view of a collection pupil 128 with a mask 126 for the two pairs of mutually-coherent illumination beams 108*a,b,c,d* of FIG. 2C, in accordance with one or more embodiments of the present disclosure.

In FIG. 2E, the mask 126 on the collection pupil 128 allows only four diffracted beams of light through. The mask 126 allows a −1-order diffracted beam (e.g., associated with illumination beams 108*a* and 108*c*) and a +1-order diffracted beam (e.g., associated with illumination beams 108*b* and 108*d*). All other diffracted beams are either blocked by the mask 126 or are diffracted outside the collection pupil 128. Therefore, only two +1-order diffracted beams and two −1-order diffracted beams pass through the mask 126 and collection pupil 128 to the detector 132. This results in dark field image of the metrology target 104 to be formed, as no 0-order diffracted beam reaches the detector 132.

While FIGS. 2D and 2E have been shown and described with relation to first-order diffraction, it should be noted that this is for illustrative purposes and not limiting purposes. Any nonzero-order diffraction may be used to create a dark field image for the sample 106.

FIG. 2F illustrates a top view of a collection pupil 128 with a mask 126 for the single pair of mutually-coherent illumination beams of FIG. 2B configured to pass second order diffraction, in accordance with one or more embodiments of the present disclosure. For example, 2F illustrates a collection pupil 128 to pass higher, non-zero order diffraction to the detector 132. Therefore, the collection pupil may include a central obscuration to block first order diffraction. Combined with the mask 126, the collection pupil of 128 may only allow second order diffraction to pass.

Additionally, the central obscuration 202 as shown in FIG. 2F may be used in instances even when it is not the goal to pass second order diffraction to the detector 132. For example, a diffraction grating 118 may not perfectly diffract the illumination beams 108. Therefore, a central obscuration 202 may block unwanted diffraction based on an imperfect diffraction grating 118.

As discussed above, it is contemplated that the patterned mirror may operate as a mask 126. However, the patterned mirror may still work in conjunction with another mask 126. In this way, the patterned mirror may block some diffraction from reaching the mask 126, while the mask 126 blocks all other unwanted diffraction from reaching the detector 132. In this way, the overlay metrology sub-system 102 effectively has two masks 126.

Figure 3A:
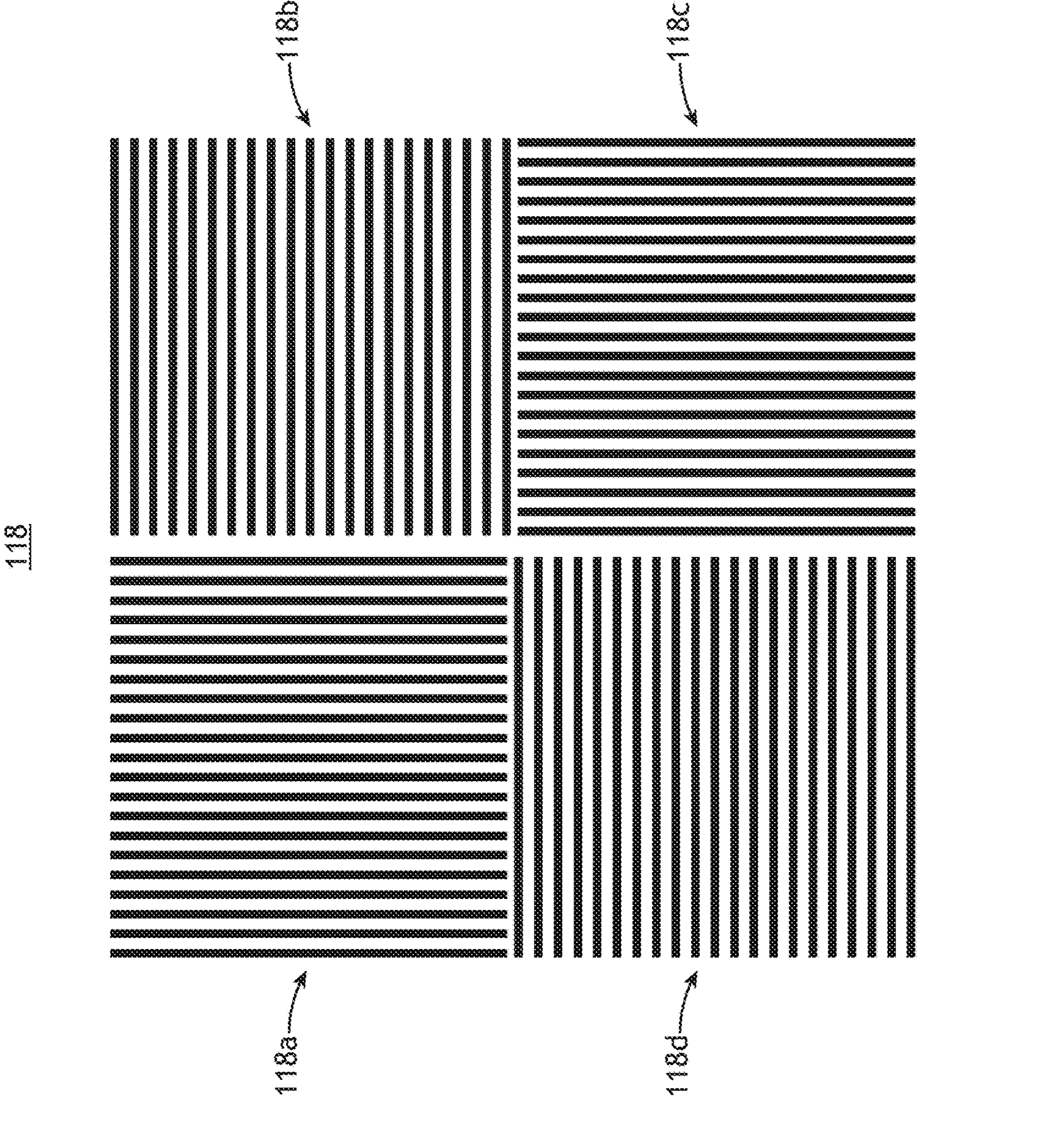
FIG. 3A illustrates a diffraction grating, in accordance with one or more embodiments of the present disclosure.
Figure 3B:
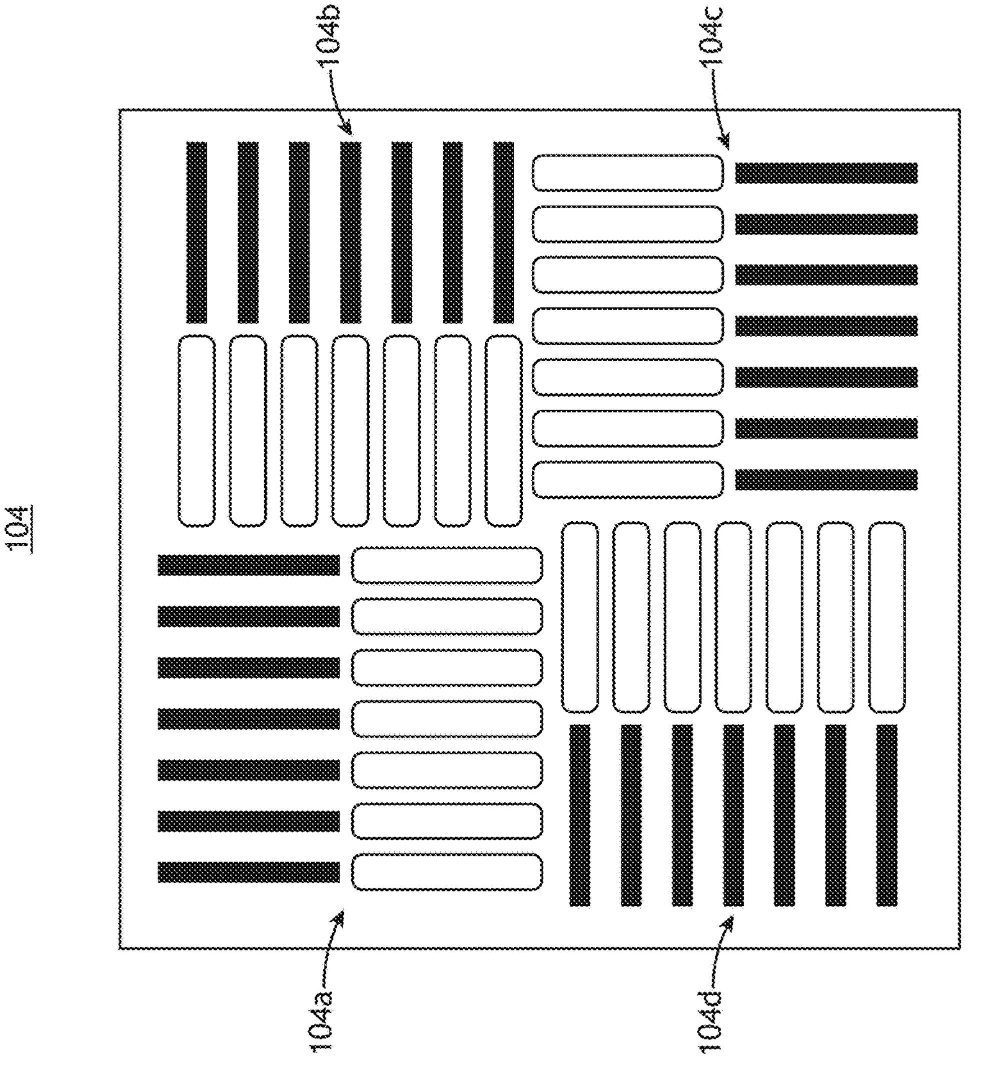
FIG. 3B illustrates an overlay target, in accordance with one or more embodiments of the present disclosure.
Figure 3B:
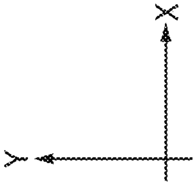

FIG. 3A illustrates a diffraction grating 118, in accordance with one or more embodiments of the present disclosure. FIG. 3B illustrates an overlay target 104, in accordance with one or more embodiments of the present disclosure.

The diffraction grating 118 may be configured to generate one or more pairs of mutually-coherent illumination beams 108 by splitting incoherent illumination produced by an incoherent illumination source 116. For example, when the metrology target 104 includes periodicity in a single measurement direction, the diffraction grating 118 may be configured to generate a single pair of mutually-coherent illumination beams 108 from incoherent illumination produced by the incoherent illumination source 116.

Where the periodic features of the metrology target 104 are arranged into two or more target cells, the diffraction grating 118 may include periodic features arranged into two or more diffraction grating cells with a common arrangement as the two or more target cells. The number of diffraction grating cells 118*a,b,c,d* may be the same as the number of target cells. Additionally, the directions of periodicity of the two or more target cells may correspond to directions of periodicity of the periodic features in the two or more target cells 104*a,b,c,d*.

For example, in FIG. 3B, the metrology target 104 includes periodic features arranged into four target cells 104*a,b,c,d*. To correspond to the four target cells 104*a,b,c,d* on the metrology target 104, the diffraction grating 118 in FIG. 3A includes four diffraction grating cells 118*a,b,c,d*.

Additionally, the periodic features in the metrology target 104 in FIG. 3B are arranged in two directions. Target cells 104*a* and 104*c* share a common direction of periodicity (e.g., the x-direction) and target cells 104*b* and 104*d* share a common direction of periodicity (e.g., the y-direction). The diffraction grating 118 is designed to correspond to these directions of periodicity. For example, the diffraction grating cells 118*a* and 118*c* correspond to target cells 104*a* and 104*c* and have a periodicity in the x-direction. By way of another example, the diffraction grating cells 118*b* and 118*d* correspond to target cells 104*b* and 104*d* and have a periodicity in the y-direction.

In embodiments, the diffraction grating 118 may be configured as any type of reflective or transmissive grating. For example, the diffraction grating 118 may be a phase grating.

It should be understood that the diffraction grating 118 shown in FIG. 3A is for illustrative purposes only and not intended to be limiting. For example, the diffraction grating 118 may be uniform across the field (e.g., not segmented) so that the target 104 is illuminated by all mutually coherent illumination beams 108. However, this may not be preferred from a light budget point of view because more light may be required to image the sample 106. Additionally, the diffraction grating 118 may be segmented even more than shown in FIG. 3A to correspond to each sub-cell in the target 104. For example, each diffraction grating cell (e.g., diffraction grating cell 104*a*) may include two or more sub-cells.

Figure 4:
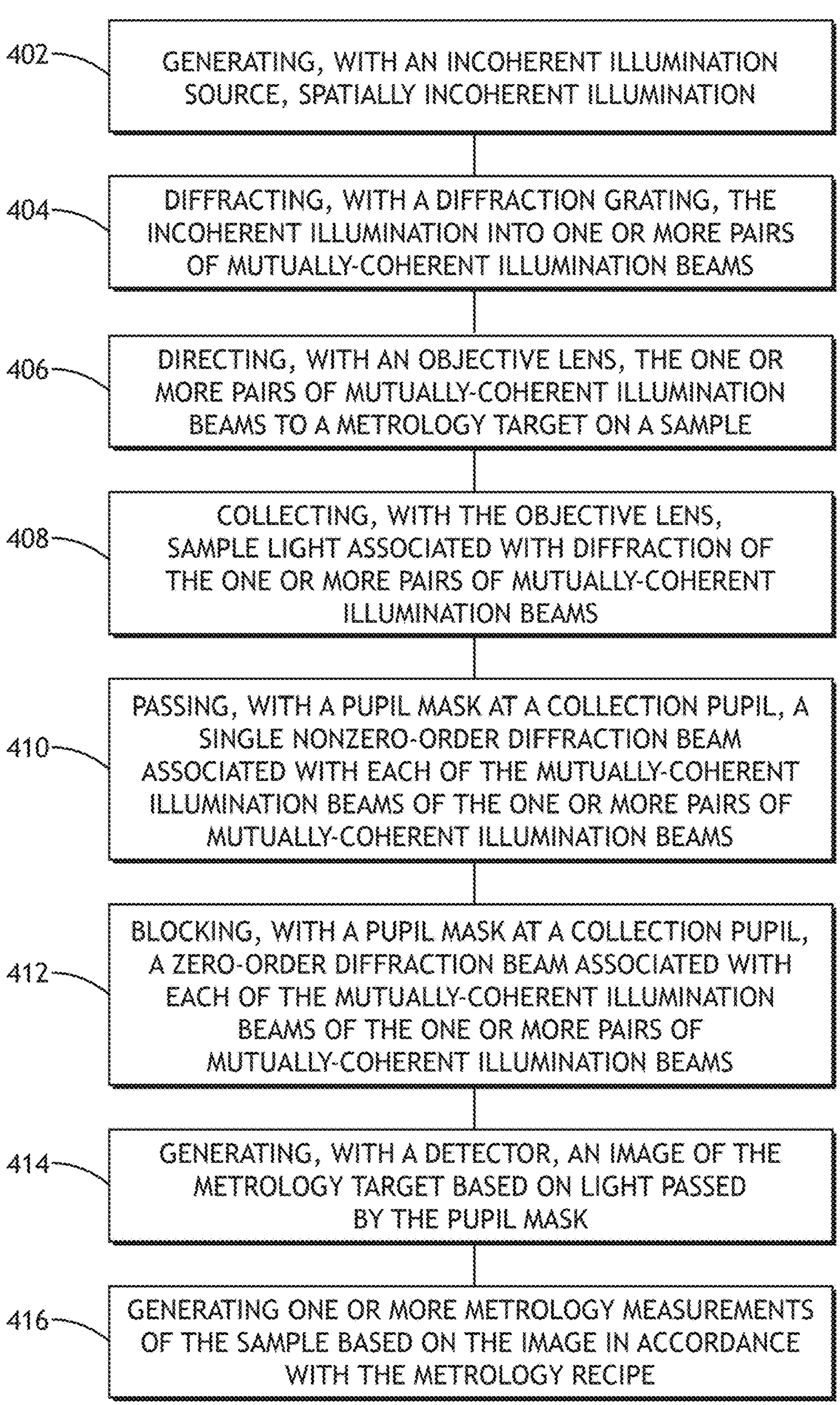
FIG. 4 illustrates a flow diagram illustrating a method, in accordance with one or more embodiments of the present disclosure.

FIG. 4 illustrates a flow diagram illustrating a method 400, in accordance with one or more embodiments of the present disclosure. Applicant notes that the embodiments and enabling technologies described previously herein in the context of the overlay metrology system 100 should be interpreted to extend to method 400. It is further noted, however, that the method 400 is not limited to the architecture of the overlay metrology system 100.

In embodiments, the method 400 includes a step 402 of generating, with an incoherent illumination source, incoherent illumination.

A single incoherent illumination source may provide sufficient illumination to perform overlay metrology on a sample.

In embodiments, the method 400 includes a step 404 of diffracting, with a diffraction grating, the incoherent illumination into one or more pairs of mutually coherent illumination beams.

For example, the diffraction grating may be designed such that a single pair of mutually coherent beams are formed from the incoherent illumination. By way of another example, the diffraction grating may be designed such that two pairs of mutually coherent beams are formed from the incoherent illumination.

Additionally, when the periodic features of the metrology target are arranged into two or more target cells, the diffraction grating may include periodic features arranged into two or more diffraction grating cells with a common arrangement as the two or more target cells. The directions of periodicity of features in the two or more diffraction grating cells may match directions of periodicity of the periodic features in the two or more target cells.

In embodiments, the method 400 includes a step 406 of directing, with an objective lens, the one or more pairs of mutually coherent illumination beams to a metrology target on a sample, wherein the metrology target is configured in accordance with a metrology recipe to include periodic features associated with two or more lithographic exposures.

In embodiments, the method 400 includes a step 408 of collecting, with the objective lens, sample light associated with diffraction of the one or more pairs of mutually coherent illumination beams. Thus, a single objective lens may be used to direct the one or more pairs of mutually coherent illumination to the sample and direct sample light associated with diffraction of the one or more pairs of mutually coherent illumination beams to a detector.

In embodiments, the method 400 includes a step 410 of passing, with a mask, a single nonzero-order diffraction beam associated with each of the mutually coherent illumination beams of the one or more pairs of mutually coherent illumination beams.

In embodiments, the method 400 includes a step 412 of blocking, with a mask, a zero-order diffraction beam associated with each of the mutually coherent illumination beams of the one or more pairs of mutually coherent illumination beams.

For example, the mask may block all other orders diffraction except for a single +1-order or −1-order diffraction associated with each beam (e.g., allowing a +1-order diffraction associated with a first beam and a −1-order diffraction associated with a second beam). Additionally, other orders of diffraction may be diffracted outside of the collection pupil.

In embodiments, the method 400 includes a step 414 of generating, with a detector, an image of the metrology target based on light passed by the mask. Because 0-order diffraction is blocked by the mask, a dark field image may be generated for the metrology target.

In embodiments, the method 400 includes a step 416 of generating one or more metrology measurements of the sample based on the image in accordance with the metrology recipe.

Metrology measurements may be generated for the sample when the sample has a metrology target with features having periodicity in a single measurement direction. Additionally, metrology measurements may be generated when the metrology target has a first set of periodic features along a first measurement direction and a second set of periodic features along a second measurement direction.

The method 400 may further include a step of generating correctables for one or more process tools based on the one or more metrology measurements. For example, the correctables based on one or more metrology measurements may be used to control a fabrication tool using any combination of feed-forward or feedback control techniques. As an illustration, feedback control may be used to compensate for deviations of a fabrication tool for various samples within a lot or series of lots. As another illustration, feed-forward control may be used to compensate for deviations measured at one process step for a sample or series of samples when performing a subsequent process step. Any type of fabrication tool may be controlled such as, but not limited to, a lithography tool (e.g., a scanner, a stepper, or the like), an etching tool, or a polishing tool.

It is contemplated that when the sample has a metrology target with features having periodicity in a single measurement direction, a single pair of mutually coherent illumination beams, wherein the single pair of mutually-coherent illumination beams is incident on the metrology target at opposing azimuth angles aligned with the single measurement direction may be used to generate metrology measurements for the sample. Further, when the metrology target has a first set of periodic features along a first measurement direction and a second set of periodic features along a second measurement direction, two pairs of mutually coherent illumination beams may be required to fully perform metrology measurements. The two pairs of mutually coherent illumination beams may include a first pair of mutually coherent illumination beams, wherein the first pair of mutually coherent illumination beams is incident on the metrology target at opposing azimuth angles aligned with the first measurement direction and a second pair of mutually coherent illumination beams, wherein the second pair of mutually-coherent illumination beams is incident on the metrology target at opposing azimuth angles aligned with the second measurement direction.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A metrology system comprising:

an incoherent illumination source to generate incoherent illumination;

a diffraction grating to split the incoherent illumination into one or more pairs of mutually coherent illumination beams;

an objective lens to direct the one or more pairs of mutually coherent illumination beams to a metrology target on a sample, wherein the metrology target is configured in accordance with a metrology recipe to include periodic features associated with two or more lithographic exposures, wherein the objective lens further collects sample light associated with diffraction of the one or more pairs of mutually-coherent illumination beams;

one or more masks, wherein the one or more masks are configured in accordance with the metrology recipe to pass a single nonzero-order diffraction beam and block a zero-order diffraction beam associated with each of the mutually coherent illumination beams of the one or more pairs of mutually coherent illumination beams;

a detector configured to generate an image of the metrology target based on light passed by the one or more masks; and a controller communicatively coupled to the detector, wherein the controller includes one or more processors configured to execute program instructions causing the one or more processors to generate one or more metrology measurements of the sample based on the image in accordance with the metrology recipe.

2. The metrology system of claim 1, wherein the incoherent illumination source comprises a lamp source.

3. The metrology system of claim 1, wherein the incoherent illumination source comprises a supercontinuum source.

4. The metrology system of claim 1, wherein the incoherent source comprises a broadband illumination source, wherein at least the objective lens is corrected for chromatic aberration, wherein the image is color-corrected.

5. The metrology system of claim 1, wherein the one or more masks comprise an annular mask with a central aperture.

6. The metrology system of claim 1, wherein the one or more masks comprise an annular mask with a central obscuration.

7. The metrology system of claim 1, wherein the diffraction grating is located at a field plane conjugate to the sample.

8. The metrology system of claim 1, wherein the periodic features of the metrology target have a periodicity along a single measurement direction.

9. The metrology system of claim 8, wherein the one or more pairs of mutually coherent illumination beams comprise a single pair of mutually coherent illumination beams, wherein the single pair of mutually coherent illumination beams is incident on the metrology target at opposing azimuth angles aligned with the single measurement direction.

10. The metrology system of claim 8, wherein the one or more measurements are associated with the single measurement direction.

11. The metrology system of claim 1, wherein the periodic features of the metrology target comprise:

a first set of periodic features along a first measurement direction; and a second set of periodic features along a second measurement direction.

12. The metrology system of claim 11, wherein the one or more pairs of mutually coherent illumination beams comprise:

a first pair of mutually coherent illumination beams, wherein the first pair of mutually coherent illumination beams is incident on the metrology target at opposing azimuth angles aligned with the first measurement direction; and a second pair of mutually coherent illumination beams, wherein the second pair of mutually coherent illumination beams is incident on the metrology target at opposing azimuth angles aligned with the second measurement direction.

13. The metrology system of claim 1, wherein the periodic features of the metrology target are arranged into two or more target cells, wherein the diffraction grating includes periodic features arranged into two or more diffraction grating cells with a common arrangement as the two or more target cells, wherein directions of periodicity of features in the two or more diffraction grating cells match directions of periodicity of the periodic features in the two or more target cells.

14. The metrology system of claim 1, wherein the diffraction grating comprises a phase grating.

15. The metrology system of claim 1, wherein the mask is a pupil mask at a collection pupil.

16. The metrology system of claim 1, further comprising:

a patterned mirror, wherein the patterned mirror is configured to direct the one or more pairs of mutually coherent illumination beams to the sample and pass the single nonzero-order diffraction beam to the detector.

17. The metrology system of claim 16, wherein the patterned mirror is configured to pass a single nonzero-order diffraction beam and block a zero-order diffraction beam associated with each of the mutually coherent illumination beams of the one or more pairs of mutually coherent illumination beams.

18. The metrology system of claim 1, wherein the one or more masks comprises:

a patterned mirror.

19. A metrology method comprising:

generating, with an incoherent illumination source, incoherent illumination;

diffracting, with a diffraction grating, the incoherent illumination into one or more pairs of mutually coherent illumination beams;

directing, with an objective lens, the one or more pairs of mutually coherent illumination beams to a metrology target on a sample, wherein the metrology target is configured in accordance with a metrology recipe to include periodic features associated with two or more lithographic exposures;

collecting, with the objective lens, sample light associated with diffraction of the one or more pairs of mutually coherent illumination beams;

passing, with one or more masks, a single nonzero-order diffraction beam associated with each of the mutually coherent illumination beams of the one or more pairs of mutually coherent illumination beams;

blocking, with the one or more masks, a zero-order diffraction beam associated with each of the mutually coherent illumination beams of the one or more pairs of mutually coherent illumination beams;

generating, with a detector, an image of the metrology target based on light passed by the one or more masks; and generating one or more metrology measurements of the sample based on the image in accordance with the metrology recipe.

20. The metrology method of claim 19, wherein generating, with an incoherent illumination source, incoherent illumination comprises:

generating, with a lamp source, incoherent illumination.

21. The metrology method of claim 19, wherein generating, with an incoherent illumination source, incoherent illumination comprises:

generating, with a supercontinuum source, incoherent illumination.

22. The metrology method of claim 19, wherein generating, with an incoherent illumination source, incoherent illumination comprises:

generating, with a broadband source, incoherent illumination, wherein at least the objective lens is corrected for chromatic aberration, wherein the image is color-corrected.

23. The metrology method of claim 19, wherein the periodic features of the metrology target have a periodicity along a single measurement direction.

24. The metrology method of claim 23, wherein the one or more pairs of mutually coherent illumination beams comprise a single pair of mutually coherent illumination beams, wherein the single pair of mutually coherent illumination beams is incident on the metrology target at opposing azimuth angles aligned with the single measurement direction.

25. The metrology method of claim 19, wherein the periodic features of the metrology target comprise:

a first set of periodic features along a first measurement direction; and a second set of periodic features along a second measurement direction.

26. The metrology method of claim 25, wherein the one or more pairs of mutually coherent illumination beams comprise:

a first pair of mutually coherent illumination beams, wherein the first pair of mutually coherent illumination beams is incident on the metrology target at opposing azimuth angles aligned with the first measurement direction; and a second pair of mutually coherent illumination beams, wherein the second pair of mutually coherent illumination beams is incident on the metrology target at opposing azimuth angles aligned with the first measurement direction.

27. The metrology method of claim 19, wherein the periodic features of the metrology target are arranged into two or more target cells, wherein the diffraction grating includes periodic features arranged into two or more diffraction grating cells with a common arrangement as the two or more target cells, wherein directions of periodicity of features in the two or more diffraction grating cells match directions of periodicity of the periodic features in the two or more target cells.

28. A metrology system comprising:

a diffraction grating comprising one or more diffraction grating cells having a direction of periodicity configured to split incoherent illumination from an incoherent illumination source into one or more pairs of mutually coherent illumination beams;

an objective lens to direct the one or more pairs of mutually coherent illumination beams to a metrology target on a sample, wherein the metrology target is configured in accordance with a metrology recipe including two or more lithographic exposures to generate periodic features having a direction of periodicity arranged into one or more target cells, wherein the direction of periodicity of a target cell corresponds to the direction of periodicity of a diffraction grating cell, wherein the objective lens further collects sample light associated with diffraction of the one or more pairs of mutually coherent illumination beams;

one or more masks, wherein the one or more masks are configured in accordance with the metrology recipe to pass a single nonzero-order diffraction beam and block a zero-order diffraction beam associated with each of the mutually coherent illumination beams of the one or more pairs of mutually-coherent illumination beams;

a detector configured to generate an image of the metrology target based on light passed by the one or more masks; and a controller communicatively coupled to the detector, wherein the controller includes one or more processors configured to execute program instructions causing the one or more processors to generate one or more metrology measurements of the sample based on the image in accordance with the metrology recipe.

* * * * *